(12) United States Patent

Shin et al.

(10) Patent No.: US 10,950,822 B2
(45) Date of Patent: Mar. 16, 2021

(54) DISPLAY DEVICE CAPABLE OF IMPROVING LIGHT EXTRACTION EFFICIENCY

(71) Applicant: LG DISPLAY CO., LTD., Seoul (KR)

(72) Inventors: Kiseob Shin, Paju-si (KR); Hyoungsu Kim, Paju-si (KR); Doohyun Yoon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 133 days.

(21) Appl. No.: 16/224,280

(22) Filed: Dec. 18, 2018

(65) Prior Publication Data

US 2019/0198819 A1 Jun. 27, 2019

(30) Foreign Application Priority Data

Dec. 27, 2017 (KR) .................. 10-2017-0181328

(51) Int. Cl.
*H01L 51/52* (2006.01)
*H01L 27/32* (2006.01)

(52) U.S. Cl.
CPC ........ *H01L 51/5271* (2013.01); *H01L 27/322* (2013.01); *H01L 27/3246* (2013.01); *H01L 27/3258* (2013.01)

(58) Field of Classification Search
CPC ................................. H01L 51/5271
See application file for complete search history.

(56) References Cited

U.S. PATENT DOCUMENTS

| 2003/0016322 | A1* | 1/2003 | Ha | G02F 1/133555 349/113 |
| 2004/0179157 | A1* | 9/2004 | Kim | G02F 1/1333 349/114 |
| 2006/0152151 | A1* | 7/2006 | Seo | H01L 27/322 313/506 |
| 2006/0258061 | A1* | 11/2006 | Jung | H01L 27/12 438/149 |
| 2007/0153171 | A1* | 7/2007 | Kim | G02F 1/133555 349/114 |

FOREIGN PATENT DOCUMENTS

KR 10-2013-0031155 A 3/2013

* cited by examiner

*Primary Examiner* — Lex H Malsawma
*Assistant Examiner* — Geoffrey H Ida
(74) *Attorney, Agent, or Firm* — Birch, Stewart, Kolasch & Birch, LLP

(57) ABSTRACT

A display device is provided that can increase brightness by improving light extraction efficiency. The display device can include a thin-film transistor disposed on a substrate, a first overcoat layer disposed on the thin-film transistor and including a groove portion, a reflective layer disposed on the first overcoat layer including the inside of the groove portion, a color filter disposed on the reflective layer and located in the groove portion, a second overcoat layer disposed on the color filter and the reflective layer, a first electrode disposed on the second overcoat layer and connected to the thin-film transistor, a bank layer disposed on the first electrode and including an open portion exposing the first electrode, an organic layer disposed on the bank layer and the first electrode, and a second electrode disposed on the organic film layer.

14 Claims, 7 Drawing Sheets

DISPLAY DEVICE CAPABLE OF IMPROVING LIGHT EXTRACTION EFFICIENCY

This application claims the priority benefit of Korean Patent Application No. 10-2017-0181328, filed on Dec. 27, 2017 in the Republic of Korea, which is incorporated herein by reference for all purposes as if fully set forth herein.

BACKGROUND OF THE INVENTION

Field of the Invention

The present invention relates to a display device, and more particularly, to a display device that can increase brightness by improving light extraction efficiency.

Related Art

With the development of the information society, various demands for display devices for displaying images are on the rise. In the field of display devices, flat panel displays (FPDs), which are thin and light and can cover a large area, have been rapidly replacing cathode ray tubes (CRTs), which are bulky. The flat panel display devices include liquid crystal displays (LCDs), plasma display panels (PDPs), organic light-emitting displays (OLEDs), electrophoretic displays (EDs), etc.

Among these types of displays, the organic light-emitting displays are self-luminous devices, and have fast response time, high light emission efficiency, great brightness, and wide viewing angles. Notably, the organic light-emitting displays can be fabricated on a flexible plastic substrate, and have advantages over plasma display panels or inorganic light emitting displays in that they can operate at a low voltage, have lower power consumption, and deliver vivid color reproduction, as compared to plasma display panels or inorganic electroluminescence (EL) displays.

Organic light-emitting displays are divided into bottom-emission displays and top-emission displays depending on the direction in which light is emitted. In the bottom-emission displays, light emitted from an emissive layer is emitted toward the bottom, and in the top-emission displays, the light is emitted toward the top. In the top-emission displays, brightness is determined by light extraction efficiency because the light from the emissive layer should be emitted toward the top. Hence, there is an ongoing research on improving light extraction efficiency.

SUMMARY OF THE INVENTION

The present invention provides a display device that can increase brightness by improving light extraction efficiency.

According to an exemplary embodiment of the present invention, a display device includes a thin-film transistor disposed on a substrate; a first overcoat layer disposed on the thin-film transistor and including a groove portion; a reflective layer disposed on the first overcoat layer including the inside of the groove portion; a color filter disposed on the reflective layer and located in the groove portion; a second overcoat layer disposed on the color filter and the reflective layer; a first electrode disposed on the second overcoat layer and connected to the thin-film transistor; a bank layer disposed on the first electrode and including an open portion exposing the first electrode; an organic layer disposed on the bank layer and the first electrode; and a second electrode disposed on the organic film layer.

The open portion fully can overlap the groove portion when viewed in a plane. A size of the planar surface of the groove portion can be equal to or larger than a size of the planar surface of the open portion.

The reflective layer can be connected to the thin-film transistor via a first via hole that penetrates the first overcoat layer and can expose the thin-film transistor. The first electrode can be connected to the reflective layer via a second via hole that penetrates the second overcoat layer and can expose the first via hole.

The groove portion can have a slope of 45 to 90 degrees or a slope of 60 to 80 degrees.

The second overcoat layer can be located only within the groove portion. The surface of the first overcoat layer can coincide with the surface of the second overcoat layer. The first electrode can be a transparent electrode.

BRIEF DESCRIPTION OF THE DRAWINGS

The accompany drawings, which are included to provide a further understanding of the invention and are incorporated on and constitute a part of this specification, illustrate embodiments of the invention and together with the description serve to explain the principles of the invention. In the drawings.

DESCRIPTION OF THE EMBODIMENTS

Figure 1:
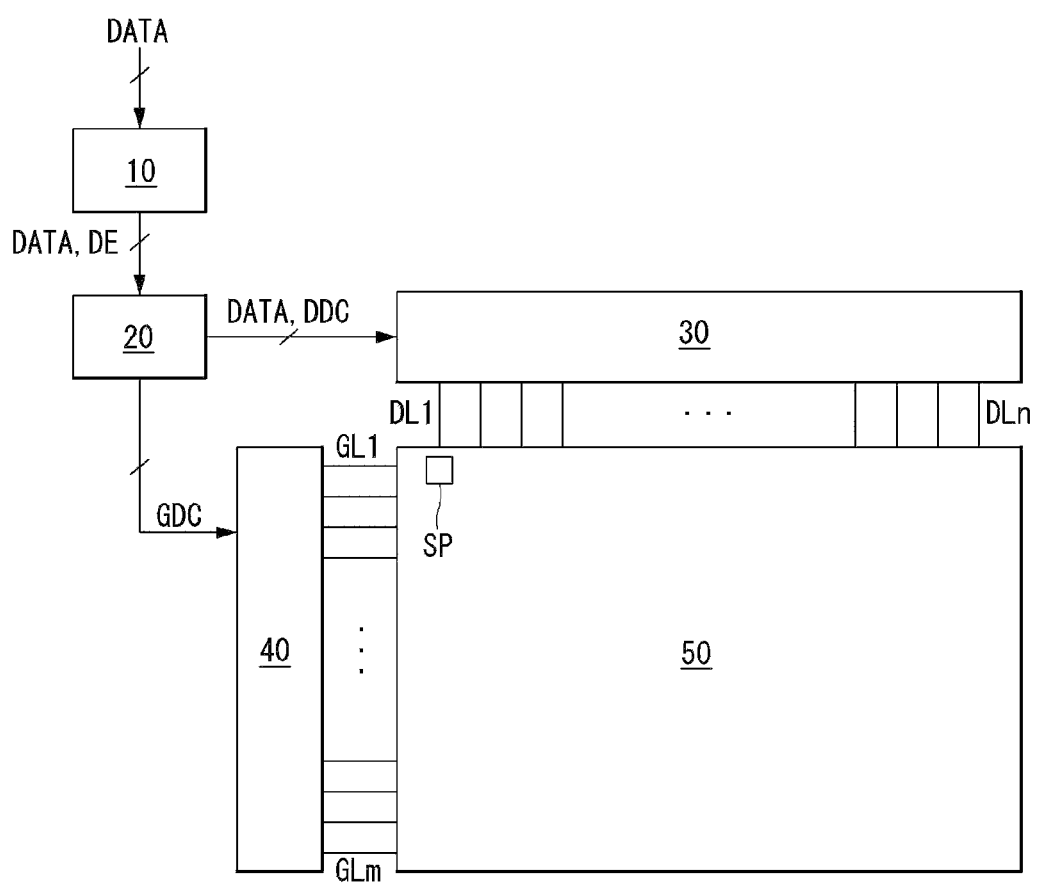
FIG. 1 is a schematic block diagram of an organic light-emitting display according to an embodiment of the present invention.

Hereinafter, exemplary embodiments of the present invention will be described in detail with reference to the attached drawings. Throughout the specification, like reference numerals denote substantially like components. In describing the present invention, a detailed description of known functions or configurations related to the present invention will be omitted when it is deemed that they can unnecessarily obscure the subject matter of the present invention. The terms and names of elements used herein are chosen for ease of description and can be different from the names of parts used in actual products. When the position relation between two parts is described using the terms "on", "over", "under", "next to" and the like, one or more parts can be positioned between the two parts as long as the term "immediately" or "directly" is not used.

A display device according to one or more embodiments of the present invention is a display device in which display elements are formed on a glass substrate or flexible substrate. Although examples of the display device comprise an organic light-emitting display, a liquid-crystal display, and an electrophoretic display, etc., the present invention will be described with respect to an organic light-emitting display. The organic light-emitting display comprises an organic layer composed of organic materials situated between a first electrode as an anode and a second electrode as a cathode. A hole from the first electrode and an electron from the second electrode recombine within the organic layer, forming an exciton, i.e., a hole-electron pair. Then, energy is created as the exciton returns to the ground state, thereby causing the self-luminous display to emit light.

The display device according to one or more embodiments of the present invention is a top-emission organic light-emitting display. In the top-emission organic light-emitting display, light emitted from an emissive layer is released through the overlying, transparent second electrode.

Hereinafter, exemplary embodiments of the present invention will be described with reference to the accompanying drawings.

Figure 2:
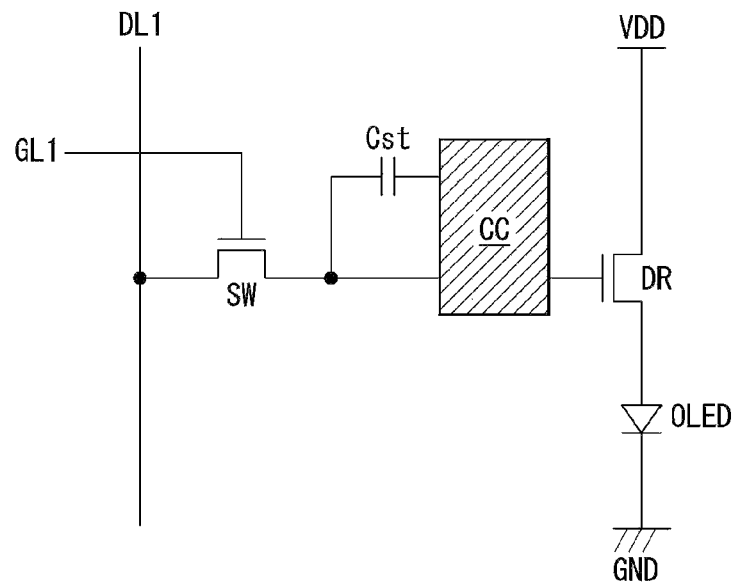
FIG. 2 is a first illustration showing a first example of the circuit configuration of a subpixel according to the present invention.
Figure 3:
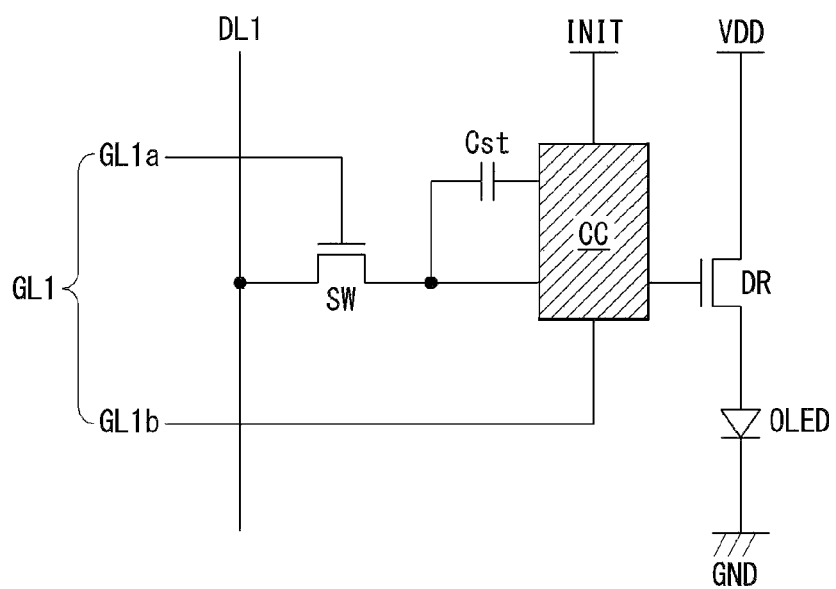
FIG. 3 is a second illustration showing a second example of the circuit configuration of a subpixel according to the present invention.

FIG. 1 is a schematic block diagram of an organic light-emitting display according to an embodiment of the present invention. FIG. 2 is a first illustration showing a first example of the circuit configuration of a subpixel according to the present invention. FIG. 3 is a second illustration showing a second example of the circuit configuration of a subpixel according to the present invention. All embodiments of the organic light-emitting display and other displays according to all embodiments of the present invention are operatively coupled and configured.

Referring to FIG. 1, an organic light-emitting display comprises an image processor 10, a timing controller 20, a data driver 30, a gate driver 40, and a display panel 50.

The image processor 10 outputs a data enable signal DE, etc., along with an externally supplied data signal DATA. The image processor 10 can output one or more among a vertical synchronization signal, horizontal synchronization signal, and clock signal, in addition to the data enable signal DE, but these signals are not shown in the drawings for convenience of explanation. The image processor 10 can be provided in the form of an IC (integrated circuit) on a system circuit board.

The timing controller 20 receives the data signal DATA from the image processor 10, along with the data enable signal DE or driving signals including the vertical synchronization signal, horizontal synchronization signal, and clock signal.

Based on the driving signals, the timing controller 20 outputs a gate timing control signal GDC for controlling the operation timing of the gate driver 40 and a timing control signal DDC for controlling the operation timing of the data driver 30. The timing controller 20 can be provided in the form of an IC on a control circuit board.

In response to the data timing control signal DDC supplied from the timing controller 20, the data driver 30 samples and latches the data signal DATA supplied form the timing controller 20, converts it to a gamma reference voltage, and outputs the gamma reference voltage. The data driver 30 outputs the data signal DATA through data lines DL1 to DLn, where n is a positive integer. The data driver 30 can be bonded onto a substrate in the form of an IC.

In response to the gate timing control signal GDC supplied from the timing controller 20, the gate driver 40 outputs a gate signal while shifting the level of a gate voltage. The gate driver 40 outputs the gate signal through gate lines GL1 to GLm, where m is a positive integer. The gate driver 40 is formed on a gate circuit substrate in the form of an IC, or is formed on the display panel 50 by a gate-in-panel (GIP) technology.

The display panel 50 displays an image, corresponding to the data signal DATA and gate signal respectively supplied from the data driver 30 and gate driver 40. The display panel 50 includes a plurality of subpixels SP that display an image.

Referring to FIG. 2, each subpixel comprises a switching transistor SW, a driving transistor DR, a compensation circuit CC, and an organic light-emitting diode OLED. The organic light-emitting diode OLED operates to emit light in response to a drive current provided by the driving transistor DR.

In response to a gate signal supplied through the gate line GL1, the switching transistor SW is switched on so that a data signal supplied through the first data line DL1 is stored as a data voltage in a capacitor Cst. The driving transistor DR operates so that a driving current flows between a high-level power supply line VDD and a low-level power supply line GND in response to the data voltage stored in the capacitor Cst. The compensation circuit CC is a circuit for compensating for the threshold voltage, etc. of the driving transistor DR. Moreover, the capacitor Cst connected to the switching transistor SW or driving transistor DR can be positioned within the compensation circuit CC. The compensation circuit CC comprises one or more thin film transistors and a capacitor. The compensation circuit CC has a wide variety of configurations depending on the compensation method, so a detailed illustration and description of this will be omitted.

As shown in FIG. 3, with the addition of the compensation circuit CC, the subpixel can further comprise a signal line, power supply line, etc. for supplying a particular signal or power, as well as driving a compensation thin-film transistor. The gate line GL1 can comprise a (1-1)-th gate line GL1*a* for supplying a gate signal to the switching transistor SW and a (1-2)-th gate line GL1*b* for driving the compensation thin-film transistor included in the subpixel. The additional power supply line can be defined as a reset power supply line INIT for resetting a particular node of the subpixel. However, this is merely an example, and the present invention is not limited thereto.

Meanwhile, FIGS. 2 and 3 illustrate a subpixel comprising a compensation circuit CC by way of example. However, if a compensating entity or circuit is located outside the subpixel, such as in the data driver 30, etc., then the compensation circuit CC can be omitted. That is, each subpixel can have a 2T(transistor)1C(capacitor) structure comprising a switching transistor SW, a driving transistor DR, a capacitor, and an organic light-emitting diode OLED, or can have various alternative structures like 3T1C, 4T2C, 5T2C, 6T2C, 7T2C, etc., for example, if the compensation circuit CC is added to the subpixel. Although FIGS. 2 and 3 illustrate that the compensation circuit CC is positioned between the switching transistor SW and the driving transistor DR, the compensation circuit CC can be positioned between the driving transistor DR and the organic light-emitting diode OLED. The position and structure of the compensation circuit CC are not limited to those shown in FIGS. 2 and 3, and include other variations.

Figure 4:
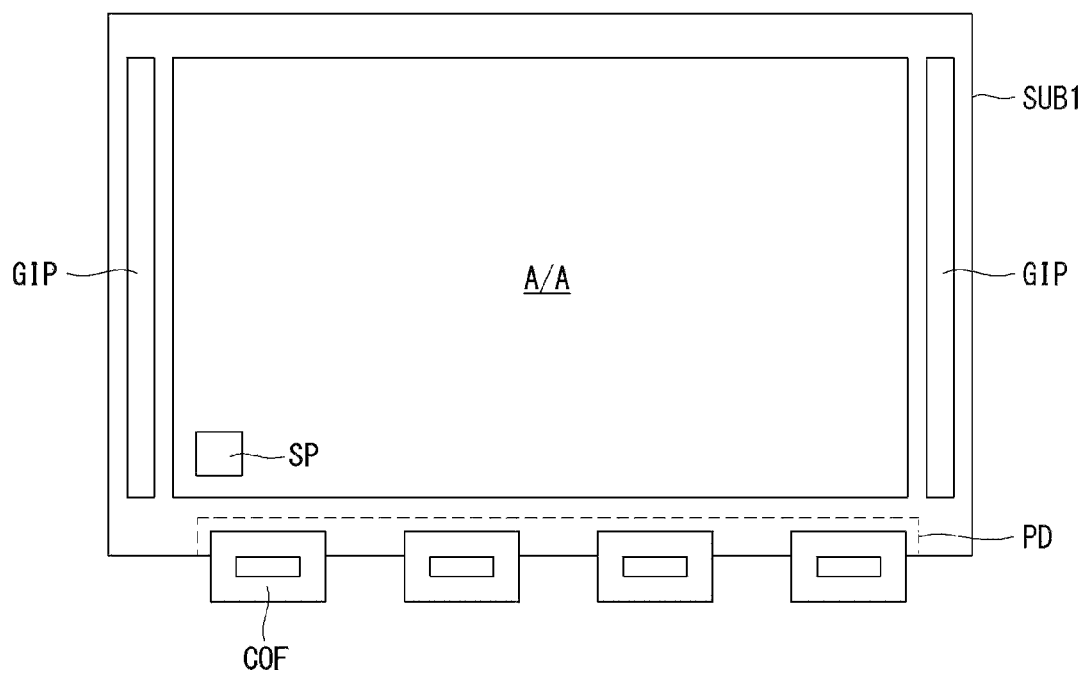
FIG. 4 is a top plan view showing an organic light-emitting display according an exemplary embodiment of the present invention.
Figure 5:
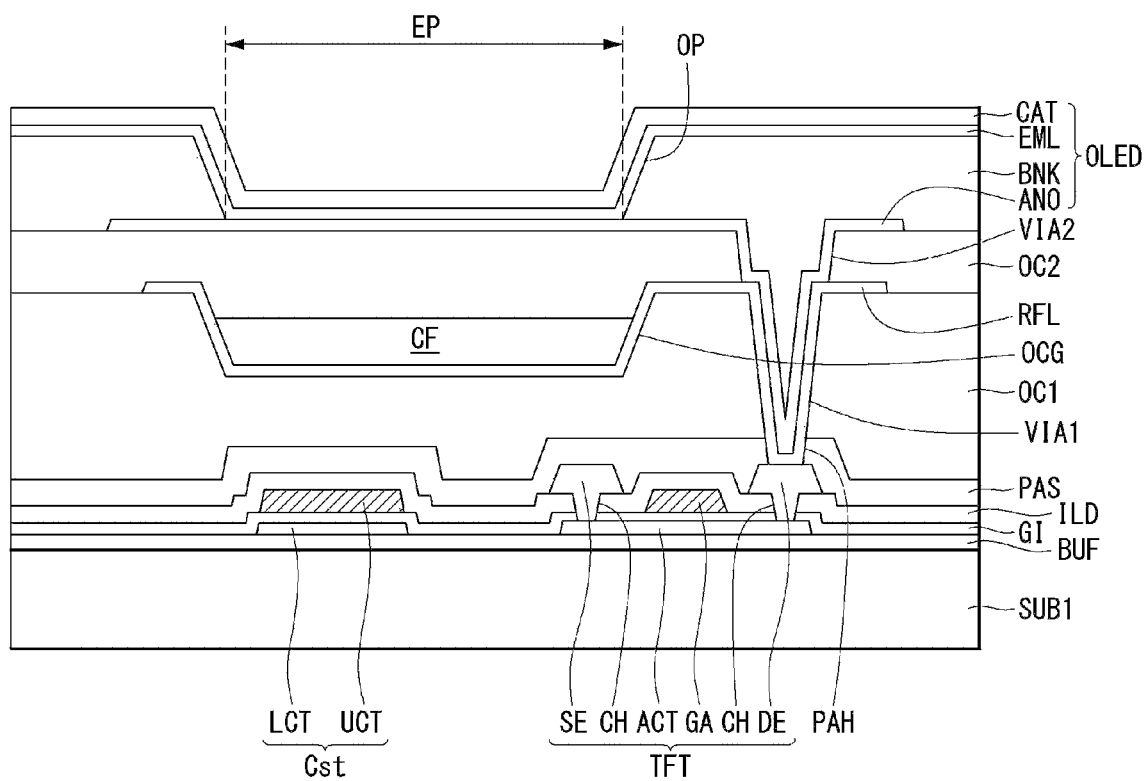
FIG. 5 is a cross-sectional view of a subpixel of the organic light-emitting display according to the exemplary embodiment of the present invention.
Figure 6:
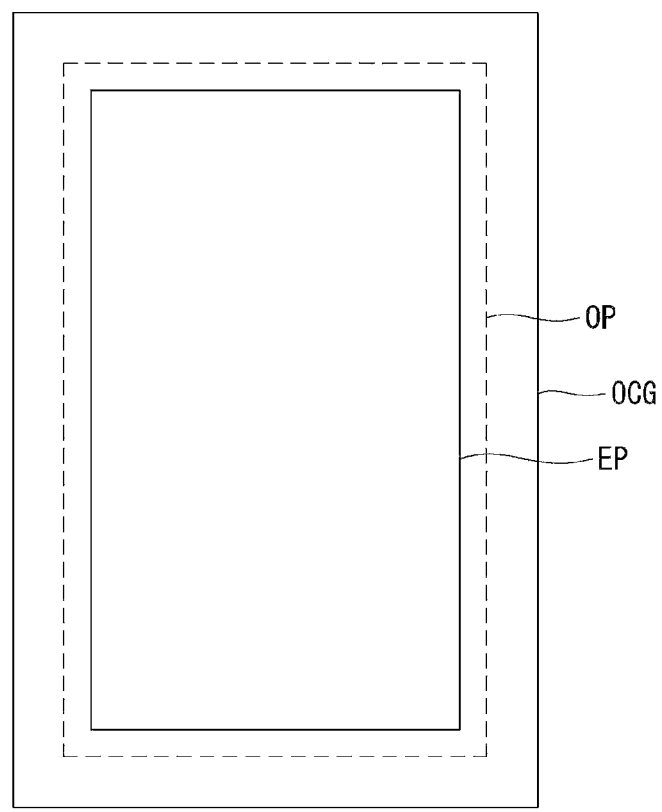
FIG. 6 is a top plan view showing a groove portion, an emitting region, and an open portion according to the exemplary embodiment of the present invention.
Figure 7:
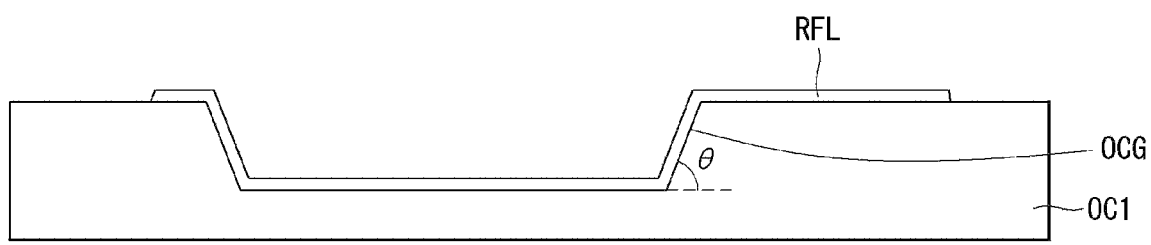
FIG. 7 is a cross-sectional view showing a groove portion in a first overcoat layer according to the exemplary embodiment of the present invention.
Figure 8:
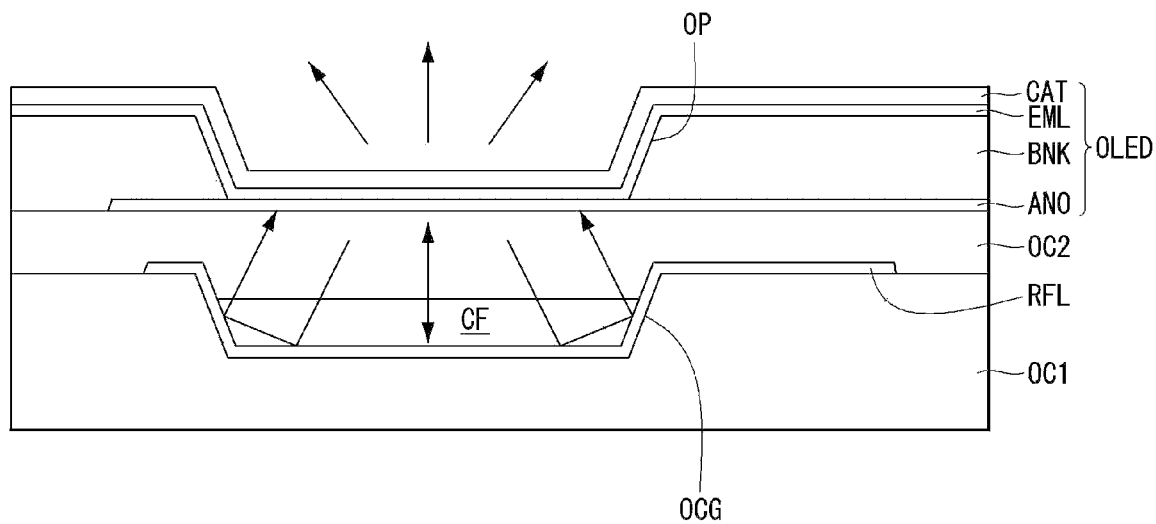
FIG. 8 is a pattern diagram showing a light reflection path.
Figure 9:
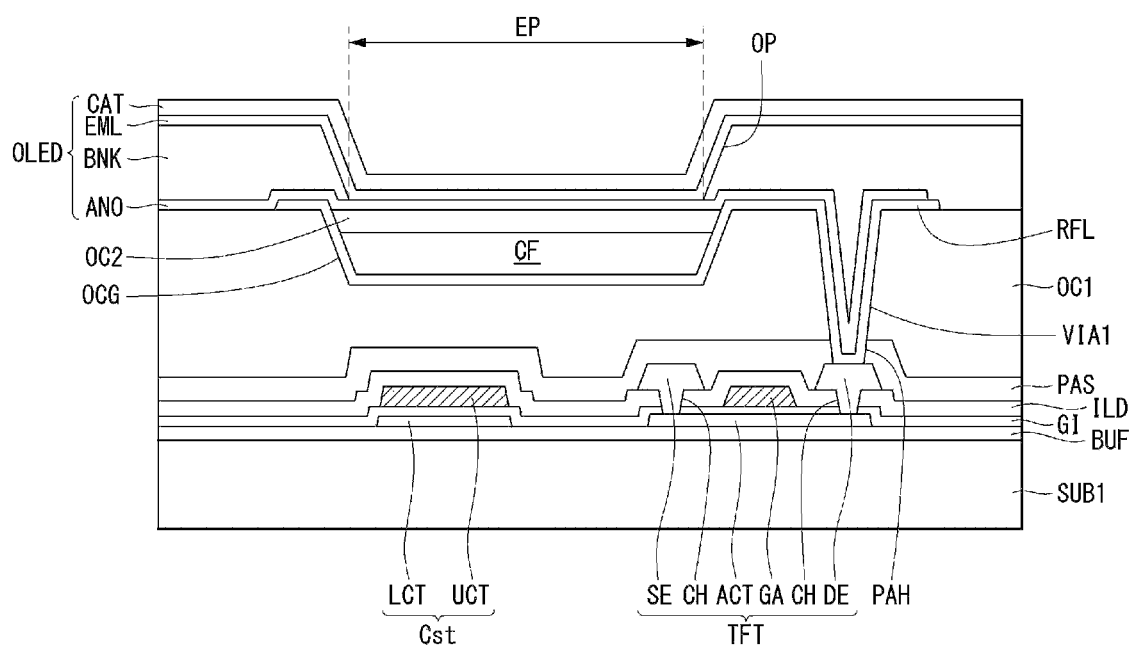
FIG. 9 is a cross-sectional view showing a display device according to another exemplary embodiment of the present invention.

FIG. 4 is a top plan view showing an organic light-emitting display according an exemplary embodiment of the present invention. FIG. 5 is a cross-sectional view of a subpixel of the organic light-emitting display according to the exemplary embodiment of the present invention. FIG. 6 is a top plan view showing a groove portion, an emitting region, and an open portion according to the exemplary embodiment of the present invention. FIG. 7 is a cross-sectional view showing a groove portion in a first overcoat layer according to the exemplary embodiment of the present invention. FIG. 8 is a pattern diagram showing a light reflection path. FIG. 9 is a cross-sectional view showing a display device according to another exemplary embodiment of the present invention.

Referring to FIG. 4, the organic light-emitting display comprises a substrate SUB1, a display area A/A, and GIP drivers GIP placed at either side of the display area A/A, and a pad portion PD placed at the bottom of the substrate SUB1. A plurality of subpixels SP are located in the display area A/A and emit R, G, and B or R, G, B, and W to represent full colors. The GIP drivers GIP are placed at either side of the display area A/A and apply a gate driving signal to the display area A/A. The pad portion PD is placed at one side of the display area A/A, for example, at the bottom side, and chip-on-films COF are bonded to the pad portion DP. Data signals and electric power are applied through the chip-on films COF to a plurality of signal lines connected from the display area A/A.

Now, a cross-sectional structure of each subpixel SP of the organic light-emitting display according to the present invention will be described with reference to FIG. 5.

Referring to FIG. 5, the organic light-emitting display according to the exemplary embodiment of the present invention has a buffer layer BUF on the substrate SUB1. The substrate SUB1 can be made of glass, plastic, or metal. The buffer layer BUF serves to protect thin-film transistors formed in a subsequent process from impurities such as alkali ions leaking out of the substrate SUB1. The buffer layer BUF can be a silicon oxide (SiOx), a silicon nitride (SiNx), or multiple layers of these compounds.

A semiconductor layer ACT and a capacitor lower electrode LCT lie on the buffer layer BUF. The semiconductor layer ACT can be formed of silicon semiconductor or oxide semiconductor. The silicon semiconductor can comprise amorphous silicon or crystallized polycrystalline silicon. The polycrystalline silicon has a high mobility (for example, more than 100 cm$^2$/Vs), low power consumption, and excellent reliability. Thus, the polycrystalline silicon can be applied to a gate driver for a driving element and/or a multiplexer (MUX) or applied to a driving TFT in a pixel. Because the oxide semiconductor has a low OFF-current, the oxide semiconductor is suitable for a switching TFT which has a short ON-time and a long OFF-time. Further, because the oxide semiconductor can increase a voltage hold time of the pixel due to the low OFF-current, the oxide semiconductor is suitable for a display device requiring low-speed operation and/or low power consumption. In addition, the semiconductor layer ACT comprises a drain region and a source region each including p-type or n-type impurities, and also comprises a channel between the drain region and the source region. The capacitor lower electrode LCT is made of the same material as the semiconductor layer ACT, and can act as a lower electrode of the capacitor as it becomes conductive by impurity doping.

A gate insulating film GI is disposed on the semiconductor layer ACT and the capacitor lower electrode LCT. The gate insulating film GI can be silicon oxide SiOx, silicon nitride SiNx, or multiple layers of these compounds. A gate electrode GA is disposed on the gate insulating film GI, corresponding to a certain area of the semiconductor layer ACT, that is, a channel for injecting an impurity, and a capacitor upper electrode UCT is disposed on the gate insulating film GI, corresponding in position to the capacitor lower electrode LOT. The gate electrode GA can be made up of any one selected from the group consisting of molybdenum (Mo), aluminum (Al), chrome (Cr), gold (Au), titanium (Ti), nickel (Ni), neodymium (Nd), and copper (Cu) or multiple layers of alloys of these elements. Further, the gate electrode GA can be a multilayer formed of one or more of molybdenum (Mo), aluminum (Al), chrome (Cr), gold (Au), titanium (Ti), nickel (Ni), neodymium (Nd), copper (Cu), or alloys of these elements. For example, the gate electrode GA can consist of dual layers of molybdenum/aluminum-neodymium or molybdenum/aluminum. The capacitor upper electrode UCT is made of the same material as the gate electrode GA. The capacitor lower electrode LCT and the capacitor upper electrode UCT form the capacitor Cst.

An interlayer insulating film ILD for insulating the gate electrode GA and the capacitor upper electrode UCT lie on the gate electrode GA and the capacitor upper electrode UCT. The interlayer insulating film ILD can be a silicon oxide film (SiOx), a silicon nitride film (SiNx), or multiple layers of these compounds. Contact holes CH exposing part of the semiconductor layer ACT are located in some regions of the interlayer insulating film ILD. A drain electrode DE and a source electrode SE lie on the interlayer insulating film ILD. The drain electrode DE is connected to the semiconductor layer ACT via the contact hole CH exposing the drain region of the semiconductor layer ACT, and the source electrode SE is connected to the semiconductor layer ACT via the contact hole CH exposing the source region of the semiconductor layer ACT.

The source electrode SE and the drain electrode DE can be a single layer or multiple layers. If the source electrode SE and the drain electrode DE consist of a single layer, they can be made up of any one selected from the group consisting of molybdenum (Mo), aluminum (Al), chrome (Cr), gold (Au), titanium (Ti), nickel (Ni), neodymium (Nd), and copper (Cu), or an alloy of these elements. On the other hand, if the source electrode SE and the drain electrode DE consist of multiple layers, they can be made up of two layers of molybdenum/aluminum-neodymium or three layers of titanium/aluminum/titanium, molybdenum/aluminum/molybdenum, or molybdenum/aluminum-neodymium/molybdenum. As such, a thin film transistor TFT comprising the semiconductor layer ACT, the gate electrode GA, the drain electrode DE, and the source electrode SE is formed.

A passivation film PAS is disposed on the substrate SUB1 comprising the thin film transistor TFT. The passivation film PAS is an insulating film that protects the underlying elements, and can be a silicon oxide film (SiOx), a silicon nitride film (SiNx), or multiple layers of these compounds. Also, a passivation hole PAH exposing the drain electrode DE is located in the passivation film PAS. A first overcoat layer OC1 is disposed on the passivation film PAS. The first overcoat layer OC1 can be a planarization film for smoothing out irregularities on the underlying structure, and is made of an organic material such as polyimide, benzocyclobutene-based resin, acrylate, etc. A first via hole VIA1 exposing the drain electrode DE is located in some region of the first overcoat layer OC1.

The organic light-emitting diode OLED is disposed on the first overcoat layer OC1. More specifically, a first electrode ANO is disposed on the first overcoat layer OC1 where the first via hole VIA1 is formed. The first electrode ANO can act as a pixel electrode, and is connected to the drain electrode DE of the thin-film transistor TFT via the first via hole VIA1. The first electrode ANO is an anode, and can be made of a transparent conductive material, for example, ITO (indium tin oxide), IZO (indium zinc oxide), or ZnO (zinc oxide).

A bank layer BNK for defining a pixel is disposed on the first electrode ANO. The bank layer BNK is made of an organic material such as polyimide, benzocyclobutene-based resin, acrylate, etc. The bank layer BNK has an open portion OP exposing some part of the first electrode ANO. An organic layer EML exposing the first electrode ANO is located on the entire surface of the substrate SUB1. The organic layer EML is a layer that emits light by the recombination of electrons and holes. A hole injection layer or hole transport layer can be formed between the organic layer EML and the first electrode ANO, and an electron transport layer or electron injection layer can be formed on the organic layer EML. A second electrode CAT is disposed on the organic layer EML. The second electrode CAT is located on the entire surface of the display area and is a cathode. The second electrode CAT can be made of a transparent metal oxide such as IZO, ITO, or ITZO, or can be made of magnesium (Mg), calcium (Ca), aluminum (Al), silver (Ag), or an alloy thereof. As a consequence, the organic light-emitting display of the present invention is configured.

Meanwhile, the display device according to an embodiment of the present invention comprises a groove portion OCG formed in the first overcoat layer OC1, a reflective layer RFL covering the groove portion OCG, a color filter located in the groove portion OCG, and a second overcoat layer OC2 covering the groove portion OCG and the color filter CF. All of these elements are situated between the organic light-emitting diode OLED and the passivation film PAS.

More particularly, the groove portion OCG is formed in the first overcoat layer OC1. The groove portion OCG is located in the first overcoat layer OC1, corresponding in position to the open portion OP of the bank layer BNK. The open portion OP fully overlaps the groove portion OCG when viewed in a plane. The open portion OP of the bank layer BNK comprises the first electrode ANO, the organic layer EML, and an emitting region EP that overlaps the second electrode CAT and emits light. The groove portion OCG of the present invention at least overlaps the emitting region EP and the open portion OP of the bank layer BNK.

The reflective layer RFL is disposed on the first overcoat layer OC1 where the groove portion OCG and the first via hole VIA1 are formed. The reflective layer RFL is connected to the drain electrode DE via the first via hole VIA1, and is disposed on the first overcoat layer OC1 comprising the inner periphery of the groove portion OCG. The reflective layer RFL of the present invention is formed across the entire inner periphery of the groove portion OCG so as to reflect the light emitted from the organic light-emitting diode OLED upward. The reflective layer RFL can be made of, but not limited to, aluminum (Al), copper (Cu), silver (Ag), nickel (Ni), or an alloy of them which provides excellent reflectivity, and is not specifically limited as long as it has excellent reflectivity.

Meanwhile, referring to FIG. 6, a size of the planar surface of the groove portion OCG is equal to or larger than a size of the planar surface of the open portion OP. For example, as shown in FIG. 6, the size of the planar surface of the groove portion OCG of the first overcoat layer OC1 is larger than the size of the planar surfaces of the open portion OP and emitting region EP. Also, the groove portion OCG of the first overcoat layer OC1 is disposed to comprise the open portion OP and the emitting region EP. Thus, the light emitted from the emitting region EP of the organic light-emitting diode OLED can be entirely received by the groove portion OCG and reflected through the reflective layer RFL.

To this end, referring to FIG. 7, the groove portion OCG of the first overcoat layer OC1 has a slope θ of 45 to 90 degrees. If the slope θ of the groove portion OCG is steeper than 45 degrees, the light emitted from the emitting region EP of the organic light-emitting diode OLED can be entirely received by the groove portion OCG and reflected upward through the reflective layer RFL. If the slope θ of the groove portion OCG is steeper than 90 degrees, light can be kept from being confined in the groove portion OCG and entirely reflected upward. In terms of light reflection efficiency, it is preferable that the groove portion OCG of the first overcoat layer OC1 has a slope θ of 60 to 80 degrees.

Referring back to FIG. 5, the color filter CF is placed in the groove portion OCG where the reflective layer RFL is formed. The color filter CF fills the groove portion OCG, and the light emitted from the organic light-emitting diode OLED can be reflected from the reflective layer RFL and its color is converted through the color filter CF.

A second overcoat layer OC2 is disposed on the first overcoat layer OC1, reflective layer RFL, and color filter CF to cover them. The second overcoat layer OC2 can smooth out irregularities caused by the underlying groove portion OCG, reflective layer RFL, and color filter CF. The second overcoat layer OC2 can be made of the same material as the aforementioned first overcoat layer OC1. The second overcoat layer OC2 is not specifically limited to a certain thickness but is preferably formed thick enough to smooth out the irregularities under it.

A second via hole VIA2 exposing the underlying first via hole VIA1 and reflective layer RFL is formed in the second overcoat layer OC2. The first electrode ANO is disposed on the second overcoat layer OC2, and is connected to the reflective layer RFL via the second via hole VIA2. Thus, the first electrode ANO is connected to the drain electrode DE of the thin-film transistor TFT through the reflective layer RFL.

Referring to FIG. 8, the light emitted downward from the organic light-emitting diode OLED is entirely received in the groove portion OCG of the first overcoat layer OC1 and reflected by the reflective layer RFL and re-emitted upward. Therefore, it is possible to reduce the amount of light emitted downward from the organic light-emitting diode OLED but lost to the bottom or side, thereby improving light extraction efficiency and, as a result, increasing brightness.

FIG. 9 is a cross-sectional view showing a display device according to another exemplary embodiment of the present invention. In what follows, the same components as the above-described display device will be denoted by the same reference numerals, and a description of them will be given briefly.

Referring to FIG. 9, the organic light-emitting display according to another exemplary embodiment of the present invention has a buffer layer BUF on the substrate SUB1, and a semiconductor layer ACT and a capacitor lower electrode LCT lie on the buffer layer BUF. A gate insulating film GI is disposed on the semiconductor layer ACT and the capacitor lower electrode LCT. A gate electrode GA is disposed on the gate insulating film GI, corresponding to a certain area of the semiconductor layer ACT, and a capacitor upper electrode UCT is disposed on the gate insulating film GI, corresponding in position to the capacitor lower electrode LCT. The capacitor lower electrode LCT and the capacitor upper electrode UCT form the capacitor Cst.

An interlayer insulating film ILD for insulating the gate electrode GA and the capacitor upper electrode UCT lie on the gate electrode GA and the capacitor upper electrode UCT. Contact holes CH exposing part of the semiconductor layer ACT are located in some regions of the interlayer insulating film ILD. A drain electrode DE and a source electrode SE lie on the interlayer insulating film ILD. As such, a thin film transistor TFT comprising the semiconductor layer ACT, the gate electrode GA, the drain electrode DE, and the source electrode SE is formed.

A passivation film PAS is disposed on the substrate SUB1 comprising the thin film transistor TFT, and a passivation hole PAH exposing the drain electrode DE is located in the passivation film PAS. A first overcoat layer OC1 is disposed on the passivation film PAS, and a first via hole VIA1 exposing the drain electrode DE is located in some region of the first overcoat layer OC1.

The organic light-emitting diode OLED is disposed on the first overcoat layer OC1. More specifically, a first electrode ANO is disposed on the first overcoat layer OC1 where the first via hole VIA1 is formed, and a bank layer BNK for defining a pixel is disposed on the first electrode ANO. The bank layer BNK has an open portion OP exposing some part of the first electrode ANO. An organic layer EML exposing the first electrode ANO is located on the entire surface of the substrate SUB1, and a second electrode CAT is disposed on the organic layer EML.

Meanwhile, the display device comprises a groove portion OCG formed in the first overcoat layer OC1, a reflective layer RFL covering the groove portion OCG, a color filter located in the groove portion OCG, and a second overcoat layer OC2 covering the groove portion OCG and the color filter CF. All of these elements are situated between the organic light-emitting diode OLED and the passivation film PAS.

In particular, in the exemplary embodiment of the present invention, the second overcoat layer OC2 fills the groove portion OCG of the first overcoat layer OC1 and is located only within the groove portion OCG. The second overcoat layer OC2 can smooth out irregularities caused by the color filter CF in the groove portion OCG. Notably, there is an advantage in that the underlying irregularities can be smoothened out since the surface of the second overcoat layer OC2 coincides with the surface of the first overcoat layer OC1.

The first electrode ANO is disposed on the first overcoat layer OC1 and the second overcoat layer OC2, and is connected to the reflective layer RFL via the first via hole VIA1. Thus, the first electrode ANO is connected to the drain electrode DE of the thin-film transistor TFT through the reflective layer RFL.

As discussed above, in the display device according to the exemplary embodiment of the present invention, the light emitted downward from the organic light-emitting diode OLED can be reflected by the reflective layer RFL over the groove portion of the first overcoat layer and emitted upward. Therefore, it is possible to reduce the amount of light emitted downward from the organic light-emitting diode OLED but lost to the bottom or side, thereby improving light extraction efficiency and, as a result, increasing brightness.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a thin-film transistor disposed on a substrate;
a first overcoat layer disposed on the thin-film transistor and comprising a groove portion;
a reflective layer disposed on the groove portion of the first overcoat layer;
a color filter disposed on the reflective layer and located in the groove portion;
a second overcoat layer disposed on the color filter and the reflective layer;
a first electrode disposed on the second overcoat layer and connected to the thin-film transistor;
a bank layer disposed on the first electrode and comprising an open portion exposing the first electrode;
an organic layer disposed on the bank layer and the first electrode; and
a second electrode disposed on the organic film layer,
wherein the reflective layer is disposed to be extended outside of edges of the color filter in a horizontal direction according to an upper surface of the first overcoat layer,
wherein a size of a planar surface of the reflective layer is larger than a size of a planar surface of the color filter, and
wherein at least a portion of the reflective layer is disposed between the first overcoat layer and the color filter.

2. The display device of claim 1, wherein the open portion of the bank layer fully overlaps the groove portion of the first overcoat layer when viewed in a plane.

3. The display device of claim 2, wherein a size of a planar surface of the groove portion of the first overcoat layer is equal to or larger than a size of a planar surface of the open portion of the bank layer.

4. The display device of claim 1, wherein the reflective layer is connected to the thin-film transistor via a first via hole that penetrates the first overcoat layer and exposes the thin-film transistor.

5. The display device of claim 4, wherein the first electrode is connected to the reflective layer via a second via hole that penetrates the second overcoat layer and exposes the first via hole.

6. The display device of claim 1, wherein the groove portion of the first overcoat layer has a slope of approximately 45 to 90 degrees.

7. The display device of claim 6, wherein the groove portion of the first overcoat layer has a slope of approximately 60 to 80 degrees.

8. The display device of claim 1, wherein the second overcoat layer is located only within the groove portion of the first overcoat layer.

9. The display device of claim 8, wherein a surface of the first overcoat layer coincides with a surface of the second overcoat layer.

10. The display device of claim 1, wherein the first electrode is a transparent electrode.

11. The display device of claim 1, wherein the reflective layer is disposed in the groove portion and on a portion of the upper surface of the first overcoat layer.

12. The display device of claim 1, wherein the groove portion has a predetermined depth smaller than a thickness of the first overcoat layer.

13. The display device of claim 12, wherein the color filter has a thickness smaller than the predetermined depth of the groove portion.

14. The display device of claim 1, wherein the groove portion includes a bottom surface, and a lateral wall extended from the bottom surface and connected to the upper surface of the first overcoat layer, and
    wherein the reflective layer is disposed on a portion of the upper surface of the first overcoat layer, and on the lateral wall and the bottom surface of the groove portion.

\* \* \* \* \*